US011204386B2

United States Patent
Park et al.

(10) Patent No.: US 11,204,386 B2
(45) Date of Patent: Dec. 21, 2021

(54) RELAY DIAGNOSIS CIRCUIT

(71) Applicant: LG Chem, Ltd., Seoul (KR)

(72) Inventors: Jaedong Park, Daejeon (KR); Hyunki Cho, Daejeon (KR); Sang Hoon Lee, Daejeon (KR); Yean Sik Choi, Daejeon (KR)

(73) Assignee: LG Chem, Ltd.

( * ) Notice: Subject to any disclaimer, the term of this patent is extended or adjusted under 35 U.S.C. 154(b) by 105 days.

(21) Appl. No.: 16/620,643

(22) PCT Filed: Oct. 15, 2018

(86) PCT No.: PCT/KR2018/012108
§ 371 (c)(1),
(2) Date: Dec. 9, 2019

(87) PCT Pub. No.: WO2019/093667
PCT Pub. Date: May 16, 2019

(65) Prior Publication Data
US 2020/0142002 A1 May 7, 2020

(30) Foreign Application Priority Data
Nov. 7, 2017 (KR) .................. 10-2017-0147364

(51) Int. Cl.
*G01R 31/327* (2006.01)
*G01R 31/385* (2019.01)
(Continued)

(52) U.S. Cl.
CPC ....... *G01R 31/3278* (2013.01); *G01R 19/165* (2013.01); *G01R 19/22* (2013.01);
(Continued)

(58) Field of Classification Search
CPC .. G01R 31/00; G01R 31/327; G01R 31/3275; G01R 31/3277; G01R 31/3278;
(Continued)

(56) References Cited

U.S. PATENT DOCUMENTS 5,568,025 A * 10/1996 Sumida ................ H02H 7/0844
318/280
8,688,317 B2 4/2014 Boiron et al.
(Continued)

FOREIGN PATENT DOCUMENTS

| CN | 102175971 A | 9/2011 |
| CN | 102269790 A | 12/2011 |

(Continued)

OTHER PUBLICATIONS

International Search Report from Application No. PCT/KR2018/012108 dated Jan. 21, 2019, 2 pages.
(Continued)

*Primary Examiner* — Hoai-An D. Nguyen
(74) *Attorney, Agent, or Firm* — Lerner, David, Littenberg, Krumholz & Mentlik, LLP

(57) ABSTRACT

A relay diagnosis circuit capable of diagnosing whether a relay connected to a negative electrode of a battery pack normally operates using voltage applied from a positive electrode of the battery pack.

6 Claims, 3 Drawing Sheets

(51) Int. Cl.
    *G01R 19/165*     (2006.01)
    *G01R 19/22*      (2006.01)
    *B60L 50/50*      (2019.01)
    *B60L 1/04*       (2006.01)

(52) U.S. Cl.
    CPC .............. *G01R 31/385* (2019.01); *B60L 1/04* (2013.01); *B60L 50/50* (2019.02)

(58) Field of Classification Search
    CPC .... G01R 31/385; G01R 19/00; G01R 19/165; G01R 19/22; B60L 50/00; B60L 50/50; B60L 1/00; B60L 1/02; B60L 1/04
    USPC ......... 324/415, 416, 418–424; 340/3.1, 3.22, 340/3.23, 3.8, 644; 361/1, 78–80, 93.1, 361/94, 99, 139, 157, 160, 166, 183, 184, 361/191, 206, 626, 819
    See application file for complete search history.

(56) References Cited

U.S. PATENT DOCUMENTS

| | | | |
|---|---|---|---|
| 9,606,161 | B2 | 3/2017 | Park |
| 10,753,975 | B2 * | 8/2020 | Park ......................... H02J 7/00 |
| 2016/0268933 | A1 * | 9/2016 | Kim ......................... H02P 27/02 |
| 2019/0036526 | A1 * | 1/2019 | Nikander ............... H02H 3/044 |

FOREIGN PATENT DOCUMENTS

| | | |
|---|---|---|
| CN | 102830351 A | 12/2012 |
| CN | 102866353 A | 1/2013 |
| CN | 104391241 A | 3/2015 |
| CN | 105137336 A | 12/2015 |
| CN | 106501712 A | 3/2017 |
| JP | 2009229404 A | 10/2009 |
| JP | 2012182892 A | 9/2012 |
| JP | 2013500548 A | 1/2013 |
| JP | 2014048050 A | 3/2014 |
| JP | 2016127769 A | 7/2016 |
| KR | 20130039817 A | 4/2013 |
| KR | 20130079843 A | 7/2013 |
| KR | 20140007180 A | 1/2014 |
| KR | 20140136844 A | 12/2014 |
| KR | 20150047367 A | 5/2015 |
| KR | 20160054935 A | 5/2016 |
| KR | 20160079507 A | 7/2016 |

OTHER PUBLICATIONS

Extended European Search Report for Application No. EP18875073.1 dated Jun. 18, 2020, 3 pgs.

Chinese Search Report for Application No. 201880034682.4, dated Apr. 25, 2021, 3 pages.

* cited by examiner

[Figure 1]
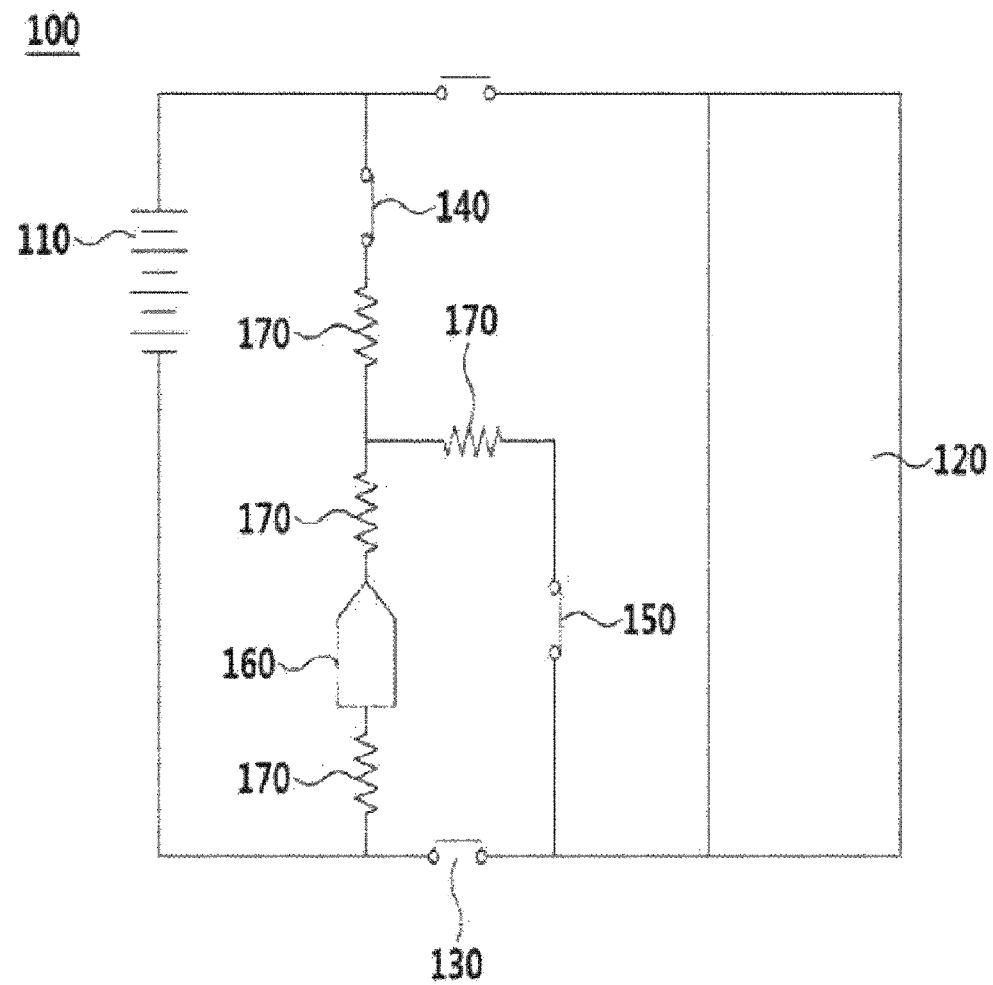

[Figure 2]
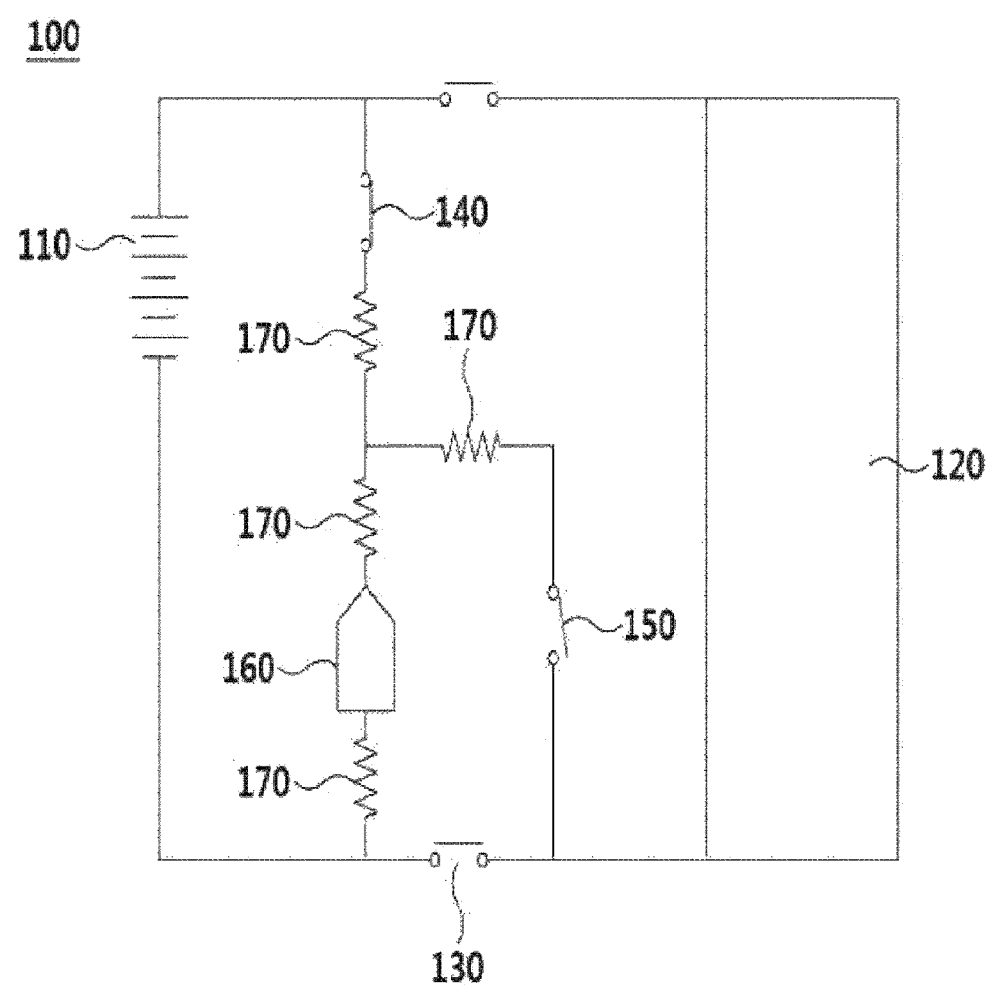

[Figure 3]
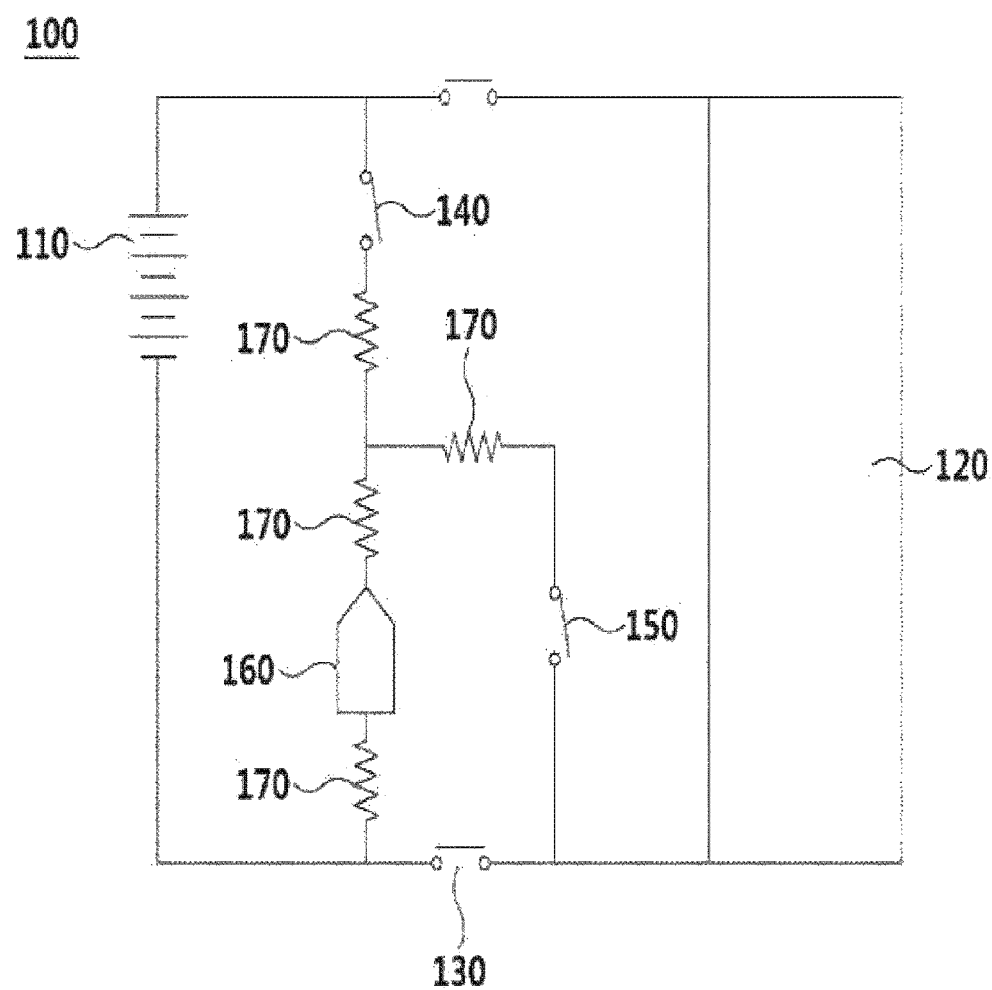

RELAY DIAGNOSIS CIRCUIT

CROSS-REFERENCE TO RELATED APPLICATIONS

The present application is a national phase entry under 35 U.S.C. § 371 of International Application No. PCT/KR2018/012108 filed Oct. 15, 2018, published in Korean, which claims priority from Korean Patent Application 10-2017-0147364 filed Nov. 7, 2017, all of which are incorporated herein by reference.

TECHNICAL FIELD

This application claims priority to and the benefit of Korean Patent Application No. 10-2017-0147364 filed in the Korean Intellectual Property Office on Nov. 7, 2017, the entire contents of which are incorporated herein by reference.

The present invention relates to a relay diagnosis circuit, and more particularly, to a relay diagnosis circuit capable of diagnosing whether a relay connected to a negative electrode of a battery pack normally operates using voltage applied from a positive electrode of a battery pack.

BACKGROUND ART

In general, electric vehicles, hybrid electric vehicles (HEVs), and energy storage systems (ESS) require high voltage of DC 200 V or more for a normal operation, and therefore, essentially include a high-voltage battery pack.

In this case, a relay is connected between the high-voltage battery pack and a load to protect a battery and since the relay is driven in connection with the high-voltage battery pack, when the relay is fused, high voltage may be unintentionally applied to another system.

In recent years, in order to solve such a problem, a relay diagnosis circuit has been developed and used, in which relays are installed in positive and negative electrodes of the battery pack, respectively, and the voltage applied to the load from the battery pack through the respective relays is measured to diagnose whether the relay normally operates.

Meanwhile, such a conventional relay diagnosis circuit has an advantage in that it is possible to immediately determine whether the relay is fused, but has a problem in that in the case of the relay installed on the negative electrode of the battery pack, applied voltage is irregular, and as a result, it is difficult to accurately diagnose the relay.

Meanwhile, in order to solve such a problem, a relay diagnosis circuit has been developed, which is capable of diagnosing whether the relay installed on the negative electrode side of the battery pack normally operates by installing a separate power supply device on the negative electrode side of the battery pack, but there is another problem in that the relay diagnosis circuit is complicated in design process, and as a result, design cost increases.

SUMMARY OF THE INVENTION

Technical Problem

An object of the present invention is to provide a relay diagnosis circuit capable of accurately and efficiently diagnosing whether a relay operates normally by diagnosing whether the relay installed between a battery pack and a load operates normally by using voltage output from a positive electrode of the battery pack.

Further, an object of the present invention is to provide a relay diagnosis circuit which diagnoses whether the relay installed between the battery pack and the load operates normally by using the voltage output from the positive electrode of the battery pack without an additional facility to simplify a design of a circuit, thereby reducing circuit design cost.

In addition, an object of the present invention is to provide a relay diagnosis circuit capable of diagnosing whether the relay operates normally and measuring the voltage applied from the battery pack according to whether a switch connected to the relay is turned on or off.

Technical Solution

According to an embodiment of the present invention, a relay diagnosis circuit may include: a first switch connected in parallel with the battery pack and configured to control current applied from the batter pack; a second switch configure to control current applied from the first switch to the relay depending on an on/off state of the first switch; and a measurement unit connected in parallel with the second switch and configured to measure voltage applied through the relay depending on an on/off state of the second switch.

In an embodiment, the measurement unit may be configured to measure voltage applied from the battery pack when the first switch is in an on state and the second switch in an off state.

In an embodiment, the measurement unit may be configured to diagnose a normal operation of either the battery pack or the relay based on the measured voltage applied from the battery pack, whereby when the second switch is in the on state, the measurement unit may be configured to diagnose whether the relay operates normally and when the second switch is in the off state, the measurement unit may be configured to diagnose whether the battery pack operates normally.

In an embodiment, the relay diagnosis circuit may further include a plurality of resistors each serially connected to a respective one of the first switch, the second switch, and the measurement unit.

In an embodiment, diagnosing whether a relay controlling a connection state between a battery pack and a load normally operates may be determined based on a range of reference voltage that may be different depending on the on/off state of the first switch.

In an embodiment, the measurement unit may be a converter that is configured to convert the applied voltage into a digital signal.

Advantageous Effects

According to an aspect of the present invention, provided is a relay diagnosis circuit capable of accurately and efficiently diagnosing whether a relay operates normally by diagnosing whether the relay installed between a battery pack and a load normally operates by using voltage output from a positive electrode of the battery pack.

Further, according to another aspect of the present invention, provided is a relay diagnosis circuit which diagnoses whether the relay installed between the battery pack and the load normally operates by using the voltage output from the positive electrode of the battery pack without an additional facility to simplify a design of a circuit, thereby reducing circuit design cost.

In addition, according to yet another aspect of the present invention, provided is a relay diagnosis circuit capable of diagnosing whether the relay normally operates and measuring the voltage applied from the battery pack according to whether a switch connected to the relay is turned on or off.

BRIEF DESCRIPTION OF DRAWINGS

FIG. 1 is a diagram schematically illustrating a configuration of a relay diagnosis circuit according to an embodiment of the present invention.

FIG. 2 is a diagram schematically illustrating a state in which a first switch of the relay diagnosis circuit is turned off according to an embodiment of the present invention.

FIG. 3 is a diagram schematically illustrating a state in which the first switch of the relay diagnosis circuit is turned on and a second switch is turned off according to an embodiment of the present invention.

DETAILED DESCRIPTION OF THE DRAWINGS

The present invention will be described below in detail with reference to the accompanying drawings. Herein, the repeated description and the detailed description of publicly-known function and configuration that may make the gist of the present invention unnecessarily ambiguous will be omitted. Embodiments of the present invention are provided for more completely describing the present invention to those skilled in the art. Accordingly, shapes, sizes, and the like of elements in the drawings may be exaggerated for clearer explanation.

Throughout the specification, unless explicitly described to the contrary, a case where any part "includes" any component will be understood to imply the inclusion of stated components but not the exclusion of any other component.

In addition, the term "unit" disclosed in the specification means a unit that processes at least one function or operation, and the unit may be implemented by hardware or software or a combination of hardware and software.

In addition, throughout the specification, "On/Off" may mean "open/close" of a switch disclosed in the specification. For example, an off state of the switch may mean that the switch is opened to close a circuit connected with the switch.

Further, throughout the specification, controlling a connection state between a battery pack and a load by a relay may mean that the relay is opened or closed to connect or disconnect the battery pack and the load, but is not limited thereto.

FIG. 1 is a diagram schematically illustrating a configuration of a relay diagnosis circuit 100 according to an embodiment of the present invention.

However, the relay diagnosis circuit 100 illustrated in FIG. 1 follows the embodiment, and it should be noted that components thereof are not limited to the embodiment illustrated in FIG. 1 and as necessary, some components may be added, modified, or deleted.

Further, it is noted that the relay diagnosis circuit 100 illustrated in FIG. 1 may be applied to all technical fields to which a secondary battery may be applied.

First, referring to FIG. 1, a relay diagnosis circuit 100 according to an embodiment of the present invention may be configured to include a battery pack 110, a load 120, a relay 130, a first switch 140, a second switch 150, a measurement unit 160, and a resistor 170.

Here, the battery pack 110 may serve to supply power to the load 120 as illustrated in FIG. 1 and the battery pack 110 may be a battery pack 110 outputting high voltage, which is used for an electric vehicle, a hybrid electric vehicle (HEV), and an energy storage system (ESS), but is not limited thereto.

Next, it is noted that the load 120 may include an electric heater, a motor, a generator, or the like, which operates using a voltage applied from the battery pack 110, but is not limited thereto.

Hereinabove, since the battery pack 110 and the load 120 are components generally included in a circuit including a secondary battery, a detailed description thereof will be omitted.

Next, the relay 130 is formed between the battery pack 110 and the load 120 and may serve to control a connection state between the battery pack 110 and the load 120.

For example, when an abnormal situation such as overvoltage occurs from the battery pack 110 occurs, the relay 130 is turned off to cut off a connection between the battery pack 110 and the load 120 to serve to protect the battery pack 110 and the load 120 from the abnormal situation such as the overvoltage, etc.

Next, the first switch 140 is connected in parallel with the battery pack 110, and may serve to apply current applied from the battery pack 110 according to an on/off state to the second switch 150 and the measurement unit 160 to be described below.

For example, as illustrated in FIG. 1, when the first switch 140 is turned on, the current applied from the battery pack 110 may be applied to the second switch 150 and the measurement unit 160 through the first switch 140 and as illustrated in FIG. 2, when the first switch 140 is turned off, only the battery pack 110 and the load 120, and a relay at a positive/negative electrode side are connected to apply the current applied from the battery pack 110 only to the load 120 through the relay.

Next, the second switch 150 may be formed between the first switch 140 and the relay 130 and when the first switch 140 is in the on state, the second switch 150 may serve to apply the current applied from the battery pack 110 to the relay 130 according to the on/off state.

For example, referring to FIG. 1, when the first switch 140 and the second switch 150 are in the on state, the second switch 150 applies the current applied from the battery pack 110 to the relay 130 and measures voltage applied through the relay 130 by the measurement unit 160 to be described below to diagnose whether the relay 130 normally operates.

Meanwhile, referring to FIG. 3, when the first switch 140 is in the on state, while the second switch 150 is in the off state, the current applied from the battery pack 110 may be applied only to the measurement unit 160 to be described below through the first switch 140 and in this case, since the measurement unit 160 to be described below may measure the voltage applied from the battery pack 110, the measurement unit may diagnose whether the battery pack 110 normally operates.

Next, the measurement unit 160 may serve to diagnose whether any one of the battery pack 110 and the relay 130 normally operates according to a voltage value applied from the battery pack 110 through at least one of the first switch 140 and the second switch 150.

More specifically, when the first switch 140 and the second switch 150 are in the on state, the measurement unit 160 measures the voltage applied through the relay 130, and as a result, the measurement unit 160 may diagnose whether the relay 130 normally operates and when the first switch 140 is in the on state, while the second switch 150 is in the off state, the measurement unit 160 may measure the voltage applied from the battery pack 110, and as a result, the measurement unit 160 may diagnose whether the battery pack 110 normally operates.

In this case, a voltage range in which the measurement unit 160 diagnoses that the battery pack 110 normally operates and a voltage range in which the measurement unit 160 diagnoses that the relay 130 normally operates may be different from each other.

Meanwhile, the measurement unit 160 may be implemented as a converter that converts the measured voltage value into a digital signal and in this case, a measurement device (not illustrated) using the digital signal may diagnose whether the battery pack 110 or the relay 130 normally operates.

However, in this case, it is noted that the measurement unit 160 is not limited to being implemented only as the converter.

Next, the resistor 170 is connected to the first switch 140, the second switch 150, and the measurement unit 160 in series to serve to control the current applied to the first switch 140, the second switch 150, and the measurement unit 160.

In this case, it is noted that the resistor 170 may be a variable resistor, and a resistance value of the resistor 170 may be changed according to allowable voltage ranges of the first switch 140, the second switch 150, and the measuring unit 160, but the present invention is not limited thereto.

Meanwhile, the relay 130 of the relay diagnosis circuit 100 according to an embodiment of the present invention controls the connection between the battery pack 110 and the load 120 according to the voltage value applied from the battery pack 110 and a reference voltage range for controlling the connection between the battery pack 110 and the load 120 may be changed according to the on/off state of the first switch 140.

For example, when the first switch 140 is in the off state, the current applied from the battery pack 110 to the relay 130 passes through only the load 120, but when the first switch 140 is in the on state, the current applied to the relay 130 from the battery pack 110 passes through the first switch 140, the second switch 150, and the resistor 170, and as a result, the voltage value applied to the relay 130 may be reduced. That is, in the relay 130 according to an embodiment of the present invention, since the reference voltage range for controlling the connection between the battery pack 110 and the load 130 is changed according to whether the first switch 140 is in the on/off state, it is possible to prevent misdiagnosis of the abnormal situation of the battery pack 110 due to the voltage value changed depending on whether the first switch 140 is in the on or off as described above.

Hereinabove, a specific embodiment of the present invention has been illustrated and described, but the technical spirit of the present invention is not limited to the accompanying drawings and the described contents and it is apparent to those skilled in the art that various modifications of the present invention can be made within the scope without departing from the spirit of the present invention and it will be understood that the modifications are included in the claims of the present invention without departing from the spirit of the present invention.

The invention claimed is:

1. A relay diagnosis circuit for diagnosing whether a relay controlling a connection state between a battery pack and a load normally operates, comprising:
   a first switch;
   a second switch; and
   a measurement unit connected in parallel with the second switch,
   wherein the relay diagnosis circuit is connected between a positive electrode side and a negative electrode side of the battery pack and is configured to be connected in parallel with the load,
   wherein the relay is connected between the negative electrode side of the battery pack and the load,
   wherein a first state of the first switch is configured to direct a path of current from the battery pack towards the second switch and the measurement unit, and a second state of the first switch is configured to direct the path of current from the battery pack towards the load;
   wherein a first state of the second switch is configured to direct the path of current towards the relay when the first switch is in the first state; and
   wherein the measurement unit is configured to measure voltage applied through the relay in response to the second switch being in the first state.

2. The relay diagnosis circuit of claim 1, wherein the measurement unit is configured to measure voltage applied from the battery pack when the first switch is in an on state and the second switch is in an off state.

3. The relay diagnosis circuit of claim 2, wherein the measurement unit is configured to diagnose a normal operation of either the battery pack or the relay based on the measured voltage applied from the battery pack,
   wherein:
   when the second switch is in the on state, the measurement unit is configured to diagnose a normal operation of the relay, and
   when the second switch is in the off state, the measurement unit is configured to diagnose a normal operation of the battery pack.

4. The relay diagnosis circuit of claim 1, further comprising:
   a plurality of resistors, each of the plurality of resistors serially connected to a respective one of the first switch, the second switch, and the measurement unit.

5. The relay diagnosis circuit of claim 1, wherein diagnosing whether a relay controlling a connection state between a battery pack and a load normally operates is determined based on a range of reference voltage, wherein the range of reference voltage is different depending on whether the first switch is in the first state or the second state.

6. The relay diagnosis circuit of claim 1, wherein the measurement unit is a converter configured to convert the applied voltage into a digital signal.

* * * * *